(12) United States Patent
Xie et al.

(10) Patent No.: US 10,930,568 B1
(45) Date of Patent: Feb. 23, 2021

(54) METHOD AND STRUCTURE TO IMPROVE OVERLAY MARGIN OF NON-SELF-ALIGNED CONTACT IN METALLIZATION LAYER

(71) Applicant: International Business Machines Corporation, Armonk, NY (US)

(72) Inventors: Ruilong Xie, Niskayuna, NY (US); Kangguo Cheng, Schenectady, NY (US); Chanro Park, Clifton Park, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/578,749

(22) Filed: Sep. 23, 2019

(51) Int. Cl.
| | |
|---|---|
| *H01L 21/8238* | (2006.01) |
| *H01L 21/768* | (2006.01) |
| *H01L 27/092* | (2006.01) |
| *H01L 29/78* | (2006.01) |
| *H01L 29/66* | (2006.01) |

(52) U.S. Cl.
CPC ........ *H01L 21/823871* (2013.01); *H01L 21/76831* (2013.01); *H01L 21/76832* (2013.01); *H01L 21/823821* (2013.01); *H01L 21/823864* (2013.01); *H01L 27/0924* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 8,765,585 | B2 | 7/2014 | Fan et al. |
| 9,064,801 | B1 * | 6/2015 | Horak ............... H01L 29/66545 |
| 9,412,840 | B1 | 8/2016 | Leobandung et al. |
| 9,461,143 | B2 | 10/2016 | Pethe et al. |
| 9,508,825 | B1 | 11/2016 | Basker et al. |
| 9,741,609 | B1 | 8/2017 | Cheng et al. |
| 9,818,876 | B1 | 11/2017 | Bouche |
| 10,204,818 | B2 | 2/2019 | Bao et al. |
| 10,431,495 | B1 * | 10/2019 | Cheng ............... H01L 21/76897 |
| 2008/0076216 | A1 | 3/2008 | Pae et al. |
| 2015/0137195 | A1 | 5/2015 | Lin et al. |
| 2017/0077256 | A1 | 3/2017 | Adusumilli et al. |

* cited by examiner

*Primary Examiner* — Thien F Tran
(74) *Attorney, Agent, or Firm* — Fleit Intellectual Property Law; Jose Gutman

(57) ABSTRACT

A semiconductor structure includes at least one non-self-aligned contact in a metallization layer and a fabrication method for forming the same are disclosed. The method includes forming gate metal in a gate stack on a substrate and forming a source-drain contact in a source-drain stack on the substrate. The gate stack and the source-drain stack are separated by a sidewall spacer. The method recesses the sidewall spacer thereby forming a trench. In the trench, a first outer metal liner and a second outer metal liner are recessed, horizontally enlarging the trench to form a widened trench over respective top surfaces of the recessed first outer metal liner, second outer metal liner, and sidewall spacer. The method then deposits dielectric material filling the widened trench and contacting the first inner metal core, the second inner metal core, the first outer metal liner, the second outer metal liner, and the sidewall spacer.

11 Claims, 12 Drawing Sheets

US 10,930,568 B1

METHOD AND STRUCTURE TO IMPROVE OVERLAY MARGIN OF NON-SELF-ALIGNED CONTACT IN METALLIZATION LAYER

BACKGROUND

The present invention generally relates to the field of semiconductors, and more particularly relates to a method of fabricating transistor semiconductor devices with non-self-aligned contacts.

Non-self-aligned contacts (Non-SAC) are often used in semiconductor chip fabrication for complementary metal-oxide-semiconductor (CMOS) technology. A fabrication process using non-SAC contacts in metallization layers can be lower cost, and without complex fabrication steps typically part of a Self-Aligned Contact (SAC) cap formation and a SAC etch. Due to increasingly smaller pitch values for scaling a semiconductor fabrication process, a pitch tolerance of the fabrication process can cause overlay shifts in fabrication of contacts in metallization layers which can result in 1) variable location of a vertical contact trench over a transistor active area, 2) high risk of metal contact short to adjacent circuit structures due to misalignment of vertical contact metal, and 3) an exposed sidewall spacer (e.g., a nitride sidewall spacer of a gate stack) in the vertical contact trench which can affect the performance of the metal contact due to variable overlap geometry on a semiconductor contact of a transistor. This geometry, as a result of the overlay shift, can significantly increase the resistance of an overall source/drain (S/D) contact, which can detrimentally affect the performance of an electronic circuit using the S/D contact of the respective transistor.

Therefore, the inventors have discovered that there is a need for a new fabrication method of semiconductor structures that overcomes the above mentioned problems.

SUMMARY OF THE INVENTION

Various embodiments of the present invention include fabrication of a semiconductor structure including at least one non-self-aligned contact. A method and structure, for example, include forming at least one non-self-aligned contact in a metallization layer. The method comprises: providing a semiconductor material stack including a plurality of layers, a gate stack, a source-drain stack, and a sidewall spacer adjacent to, interposed between, and contacting, the gate stack and the source-drain stack; forming gate metal in the gate stack, the gate metal including a first inner metal core and first outer metal liner contacting the first inner metal core and the sidewall spacer; forming a source-drain contact in the source-drain stack, the source-drain contact including a second inner metal core and second outer metal liner contacting the second inner metal core and the sidewall spacer; recessing the sidewall spacer thereby forming a trench; removing exposed first outer metal liner and second outer metal liner in the trench, horizontally enlarging the trench to form a widened trench over a top surface of the first outer metal liner, over a top surface of the second outer metal liner, and over a top surface of the sidewall spacer; and deposition of dielectric material filling the widened trench and contacting the first inner metal core, the second inner metal core, and the first outer metal liner, the second outer metal liner, and the sidewall spacer.

According to various embodiments, a semiconductor structure comprises a semiconductor material stack including a plurality of layers and a substrate. The semiconductor material stack includes a plurality of layers; a gate stack; a source-drain stack; and a sidewall spacer adjacent to, interposed between, and contacting, the gate stack and the source-drain stack. The gate stack includes a gate metal that includes a first inner metal core having a sidewall surface with a first portion and a second portion above and contacting the first portion, and a first outer metal liner vertically extending along the first portion of the first inner metal core and contacting the sidewall surface of the first inner metal core and the sidewall spacer, while not contacting the second portion of the sidewall surface of the first inner metal core. The source-drain stack includes a source-drain contact that includes a second inner metal core having a sidewall surface with a first portion and a second portion above and contacting the first portion, and a second outer metal liner vertically extending along the first portion of the second inner metal core and contacting the sidewall surface of the second inner metal core and the sidewall spacer, while not contacting the second portion of the sidewall surface of the second inner metal core. A dielectric material is interposed between, and contacting, the second portion of the sidewall surface of the first inner metal core and the second portion of the sidewall surface of the second inner metal core, and contacting the first outer metal liner, the second outer metal liner, and the sidewall spacer.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
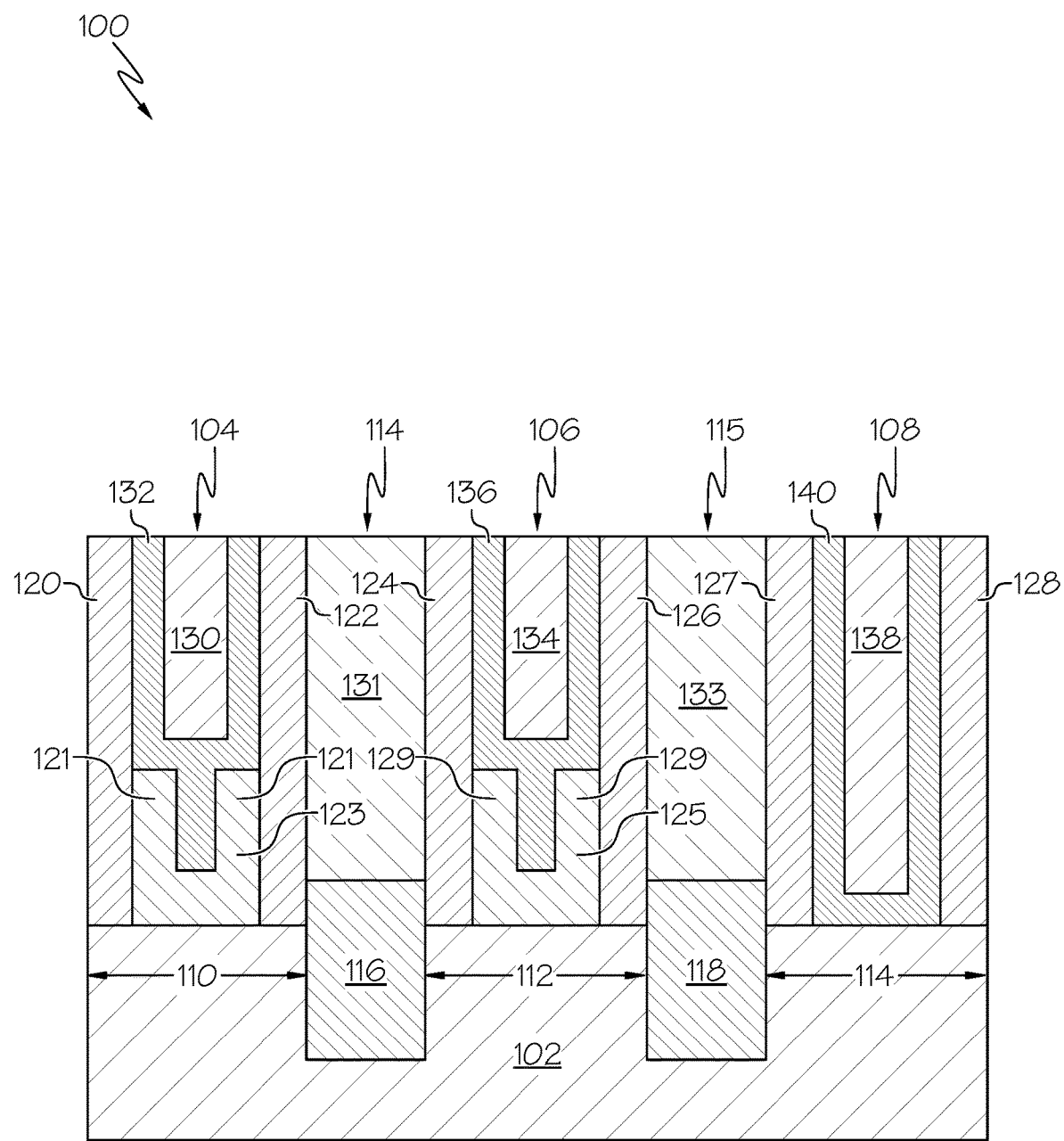
FIG. 1 is a cross-sectional side view of an example semiconductor structure at a first point in an example fabrication process such as for fabricating FET semiconductor devices, according to an embodiment of the present invention, where a top view of the semiconductor structure is also illustrated in FIG. 12 showing line A-A with arrows indicating a location and direction of the cross-sectional side views for FIGS. 1 to 9 and showing line B-B with arrows indicating a location and direction of the cross-sectional side view for FIG. 10.

It is to be understood that the present invention will be described in terms of illustrative example fabrication processes for fabricating field-effect transistor semiconductor devices. However, other semiconductor architectures, structures, substrate materials, and process features and steps may be varied within the scope of the present invention. Various embodiments of the present invention include a plurality of self-aligned contacts (SAC) on the same semiconductor substrate on a wafer. This structure may be used, for example, to create CMOS devices in an integrated circuit.

It will also be understood that when an element such as a layer, region or substrate is referred to as being "on" or "over" another element, it can be directly on the other element or intervening elements may also be present. Similar but inverse meaning will be understood for an element such as a layer, region, or substrate that is referred to as being "under" or "below" another element. It can be directly under the other element or intervening elements may also be present. In contrast, when an element is referred to as being "directly on" or "directly over", or alternatively referred to as being "directly under" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used as part of a process in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be understood that the various layers and/or regions shown in the accompanying drawings are not drawn to scale, and that one or more layers and/or regions of a type commonly used in complementary metal-oxide semiconductor (CMOS), field-effect transistor (FET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with various embodiments of the present invention can be employed in applications, hardware, and/or electronic systems. Suitable electronic hardware and systems for implementing embodiments of the invention may include, but are not limited to, personal computers, communication networks, electronic commerce systems, portable communications devices (e.g., cellular and smart phones), solid-state media storage devices, functional circuitry, etc. Systems and hardware incorporating the semiconductor devices and structures are contemplated embodiments of the invention. Given the teachings of example embodiments of the invention provided herein, one of ordinary skill in the art will be able to contemplate other implementations and applications of embodiments of the invention.

Various embodiments of the present invention can be implemented in connection with semiconductor devices, and related semiconductor fabrication processes, that may use CMOSs, MOSFETs and/or FETs technology. By way of non-limiting example, the semiconductor devices can include, but are not limited to, CMOS, MOSFET, and FET devices, and/or semiconductor devices that use CMOS, MOSFET and/or FET technology.

As used herein, "vertical" refers to a direction perpendicular to a substrate in any cross-sectional and three-dimensional views herein. Current between source/drain regions can be described herein as flowing in a vertical direction (e.g., between a bottom point in a vertical non-self-aligned contact directly contacting a source-drain epi-layer and a top point in the vertical non-self-aligned contact that is above the bottom point). As used herein, "horizontal" refers to a direction parallel to a substrate in any cross-sectional and three-dimensional views herein.

As used herein, "thickness", "thick", or the like, refers to a size of an element (e.g., a layer, trench, hole, etc.) in a cross-sectional view measured from a bottom surface to a top surface, or from a left side surface to a right side surface of the element, and/or measured with respect to a surface directly adjacent to and contacting the element (e.g., a surface on which the element is directly disposed on).

Additionally, the terms "width" or "width value", and the like, refer to a distance from a start point on a structure to an end point on the same structure, in a critical dimension. For example, a width value could be horizontally measured along a critical dimension from a start point of a vertical contact metal structure to an end point on the same vertical contact metal structure.

Unless otherwise specified, as used herein, "height" or "height above a substrate" refers to a vertical size of an element (e.g., a layer, trench, hole, etc.) in a cross-sectional view measured from a top surface of the substrate to a top surface of the element. A thickness of an element can be equal to a height of the element if the element is directly on the substrate.

As used herein, the terms "lateral," "lateral side," "lateral surface" refer to a side surface of an element (e.g., a layer, opening, a sidewall spacer, etc.), such as a left or right side surface in a cross-sectional view herein.

As used herein, the terms "pitch" or "pitch value", and the like, refer to a distance from a point on a first semiconductor structure to a corresponding point on a second semiconductor structure, in a pattern of semiconductor structures disposed on a substrate. The points of reference may be located, for example, at a start point, at a center point, or at an endpoint, of a semiconductor structure and a corresponding adjacent semiconductor structure. For example, generally with reference to FIG. 9, a pitch value might be measured along a horizontal critical dimension from a start point of a first structure, e.g., the first vertical contact metal 902, to a start point of an adjacent second structure, e.g., the second vertical contact metal 904. Pitch value measurements, for example, could be taken along a horizontal critical dimension in a pattern of first, second, third, and fourth structures, measured between the first and second structures, between the second and a third structures, between the third and a fourth structures, and so forth.

The terms "pitch walk", "pitch variability", "pitch tolerances", and the like, synonymously mean herein the same type of semiconductor structure metrology to determine pitch values of adjacent semiconductor structures in a pattern disposed on a substrate. These patterns of adjacent semiconductor structures may be used, for example, to fabricate one or more of: FET semiconductor devices, transistor semiconductor devices, vertical metallization structures in metallization layers, such as in front end of line (FEOL) metallization layers, in middle-of-line (MOL) metallization layers and in back-end-of-line (BEOL) metallization layers, and the like.

The terms viabar or super-viabar may be used interchangeably in this disclosure, and are intended to mean an electrical interconnect structure that vertically interconnects a vertically mismatched metallization contact in, for example, a BEOL metallization layer with a semiconductor contact on a surface of a layer of a semiconductor stack below (or above) the vertically mismatched metallization contact. A viabar structure, as used herein, is defined as a generally rectangular electrical wire structure (that may be also referred to as an electrical interconnect or an electrical junction) typically extending horizontally across one metallization layer in a semiconductor structure and extending vertically across two or more layers in a material stack in the semiconductor structure. A super-viabar structure, as used herein, means a viabar structure extending horizontally across a metallization layer that is disposed on top of two or more layers in a material stack in a semiconductor structure in which the super-viabar structure is extending vertically across the two or more layers in the material stack in the semiconductor structure. The super-viabar structure provides an electrical interconnect or an electrical junction between features in the two or more layers in the material stack in the semiconductor structure.

Figure 12:
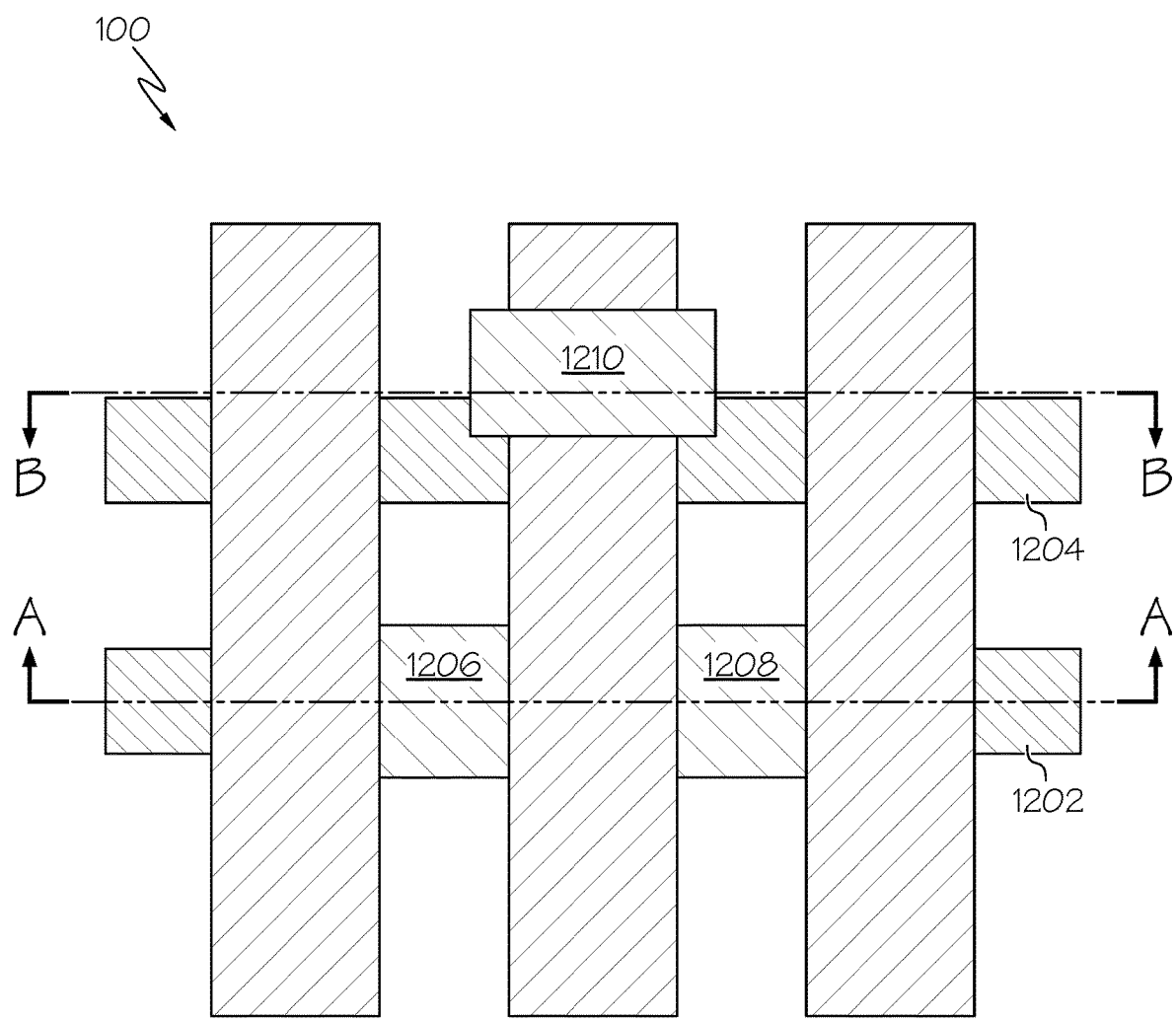
FIG. 12 is a top planar view of the semiconductor structure as shown in FIGS. 9 and 10.

Referring now to the drawings in which like numerals represent the same or similar elements, FIGS. 1-9, are cross-sectional views taken along a line A-A shown in FIG. 12. The line A-A passes through a portion of the illustrated semiconductor structure 100 corresponding to a first fin 1202 for a transistor. As shown in FIG. 12, S/D metal contacts 1206, 1208, are located on either side of, and adjacent to, a gate stack, which are all traversed by the cross-sectional view taken along line A-A. FIG. 10 is a cross-sectional view taken along a line B-B shown in FIG. 12. The line B-B passes through a portion of the illustrated semiconductor structure 100 corresponding to a second fin 1204 for a transistor. As shown in FIG. 12, a gate metal contact 1210 is located over the second fin 1204, which are traversed by the cross-sectional view taken along line B-B. FIG. 12 is a top planar view of the illustrated semiconductor structure 100.

Non-self-aligned contacts (Non-SAC) are often used in semiconductor chip fabrication for complementary metal-oxide-semiconductor (CMOS) technology below 14 nm nodes. Due to limited available space for placing, for example, transistor source/drain (S/D) metal contacts 1206, 1208, and adjacent gate stacks, an S/D metal contact might be located very close, along a horizontal critical dimension, to an adjacent gate stack of a transistor. A sidewall spacer insulating material (e.g., a nitride containing material) typically separates the conductive S/D contacts 1206, 1208, from the adjacent gate stack of the transistor. Sidewall spacers also can separate a gate metal contact 1210 from adjacent source/drain stacks.

Any sidewall spacer in the present example comprises at least one dielectric material selected from the following set of dielectric materials consisting of: Silicon Nitride (SiN), Silicon Carbide (SiC), SiCO, Silicon Oxide (SiO), Silicon Dioxide ($SiO_2$), Carbon Doped Silicon Oxide (SiCOH), SiCH, one or more silicon-based materials with some or all of the Si replaced by Ge, carbon-doped oxides, inorganic oxides, inorganic polymers, hybrid polymers, organic polymers such as polyamides or SiLK™, other carbon-base materials, organo-inorganic materials such as spin-on glasses and silsesquioxane-based materials, diamond-like carbon (DLC, also known as amorphous hydrogenated carbon, α-C:H), or any of the aforementioned materials in porous form, or in a form that changes during processing to or from being porous and/or permeable to being non-porous and/or non-permeable.

The example semiconductor structure 100 shown in FIG. 1 will be used in the present discussion to illustrate an example semiconductor fabrication process, according to various embodiments of the invention.

As shown in FIG. 1, a plurality of gate stacks 104, 106, 108, are interposed, and adjacent to, a respective plurality of S/D stacks 114, 115. A plurality of sidewall spacers 120, 122, 124, 126, 127, 128, interposed between the gate stacks and the S/D stacks, separates the plurality of gate stacks 104, 106, 108, from the plurality of S/D stacks 114, 115, as shown in FIG. 1. All of the stacks are supported on a substrate 102. The substrate 102, according to various embodiments, comprises at least one material selected from the following set of materials consisting of: silicon (Si), silicon germanium (SiGe), silicon carbide (SiC), Si:C (carbon doped silicon), silicon germanium carbide (SiGeC), carbon doped silicon germanium (SiGe:C), III-V compound semiconductor, or II-V compound semiconductor, an organic semiconductor, a layered semiconductor, a silicon-on-insulator, a SiGe-on-insulator, amorphous material, polycrystalline material, monocrystalline material, or a hybrid oriented (HOT) semiconductor material, or a combination of the materials in this set.

Each S/D stack 114, 115, includes a respective epitaxial active region 116, 118, in the substrate 102. Each S/D stack 114, 115, at the point in a semiconductor fabrication process shown in FIG. 1, includes inter-layer dielectric material 131, 133, directly above, and contacting a top surface of, the respective epitaxial active region 116, 118, in the substrate 102. FIG. 1 illustrates a point in an example semiconductor manufacturing process following a planarization process, such as by a chemical and/or mechanical planarization (CMP) step or an etching step, which removes excess material from a top surface of the semiconductor structure 100, and optionally removes excess material from a top surface of a wafer.

Each of first, second, and third, gate stacks 104, 106, 108, may be located over respective first, second, and third, fin channels 110, 112, 114, in the substrate 102. For example, a fin channel 112 is located in the substrate 102, below the second gate stack 106, and adjacent to and contacting two epitaxial active regions 116, 118, which forms a path for electrical current to pass horizontally between the two epitaxial active regions 116, 118, of a transistor. The first and second gate stacks 104, 106, in the example, are representative of a NFET gate stack for a NFET transistor. The third gate stack 108, in an example, is representative of a PFET gate stack for a PFET transistor. It should be noted that the discussions herein provide non-limiting examples for illustration of various aspects of embodiments of the invention. The example discussed above does not necessarily represent a real circuit layout. It is provided in the current discussion merely to illustrate that an example process flow, according to an embodiment of the invention, could work on either or both NFET and PFET circuit elements.

According to the example, first and second gate stacks 104, 106, include chamfered work function metal layers 123, 125, respectively, as shown in FIG. 1. A technical discussion of a WFM chamfering process is described in the following publication, with particular reference to page 44 and to FIG. 40: Scaling Challenges for advanced CMOS devices, by Ajey P. Jacob*, Ruilong Xie, Min Gyu Sung, Lars Liebmann, Rinus T. P. Lee and Bill Taylor, International Journal of High Speed Electronics and Systems Vol. 26, No. 1 (2017) 1740001 (76 pages) World Scientific Publishing Company DOI: 10.1142/S0129156417400018; which is also found at the following link: https://www.re-searchgate.net/publication/313845174_Scaling_Challenges_for_Advanced_CMOS_Devices.

Continuing with the present example, a chamfered portion 121 of a first work function metal layer 123 is in the first gate stack 104, and a chamfered portion 129 of a second work function metal layer 125 is in the second gate stack 106. Work function metal layers 123, 125, for example, can be used to tune a work function of the gate metal in the particular gate stacks 104, 106, such as to obtain low threshold voltages, e.g., a minimum gate-to-source voltage $V_{GS}$ that is needed to create a conducting path between the source and drain terminals of a field-effect-transistor (FET).

By chamfering work function metal layers 123, 125, in the respective first and second gate stacks 104, 106, a semiconductor fabrication process can recess these certain work function metal layers 123, 125, (also referred to as nWFM layers) and let them be buried below gate metal portions 130, 132, 134, 136, (also referred to as pWFM layers) of the respective first and second gate stacks 104, 106, as shown in FIG. 1. A main purpose of applying WFM chamfering here is to make metal configurations at a top surface similar for all devices despite if they are nFET or pFET devices. By doing that, it would be easier to enlarge a top spacer width of the sidewall spacers 120, 122, 124, 126, 127, 128.

A gate metal in a first gate stack 104, according to the example, includes an inner metal core 130 surrounded by an outer metal liner 132. In this example, the inner metal core is made of tungsten metal conductive material. Any of the inner metal cores discussed in the present example fabrication method can comprise at least one conductive material selected from the following set of conductive materials consisting of: Copper (Cu), Cobalt (Co), Aluminum (Al), Tungsten (W), Titanium (Ti), Tantalum (Ta), Ruthenium (Ru), Hafnium (Hf), Zirconium (Zr), Nickel (Ni), Platinum (Pt), Tin (Sn), Silver (Ag), Gold (Au), a conducting metallic compound material, or a conducting metal alloy including at least one of the preceding conductive materials.

The outer metal liner 132, continuing with the example, is made of titanium nitride conductive material. Any of the outer metal liners discussed in the present example fabrication method can comprise at least one conductive material selected from the following set of conductive materials consisting of: Titanium (Ti), Titanium Nitride (TiN), a conducting metallic compound material, or a conducting metal alloy including at least one of the preceding conductive materials.

The outer metal liner 132 is disposed on, and contacts, the chamfered work function metal layer 123 in the first gate stack 104, as shown in FIG. 1. The chamfered work function metal 123 is disposed on, and contacts, a top surface of the substrate 102.

Similarly, a gate metal in a second gate stack 106, according to the example, includes an inner metal core 134 surrounded by an outer metal liner 136. The outer metal liner 136 is disposed on, and contacts, the chamfered work function metal 125 in the second gate stack 106. The chamfered work function metal 125 in the second gate stack 106 is disposed on, and contacts a top surface of the substrate 102.

A gate metal in a third gate stack 108 includes an inner metal core 138 surrounded by an outer metal liner 140. The outer metal liner 140 of the third gate stack 108 is disposed on, and contacts a top surface of the substrate 102 as shown in FIG. 1.

It should be noted that each inner metal core 130, 134, 138, can be made of one or more types of conductive material, and is not limited to tungsten metal conductive material. It should be noted that each outer metal liner 132, 136, 140, can be made of one or more types of conductive material, and is not limited to titanium nitride conductive material.

Figure 2:
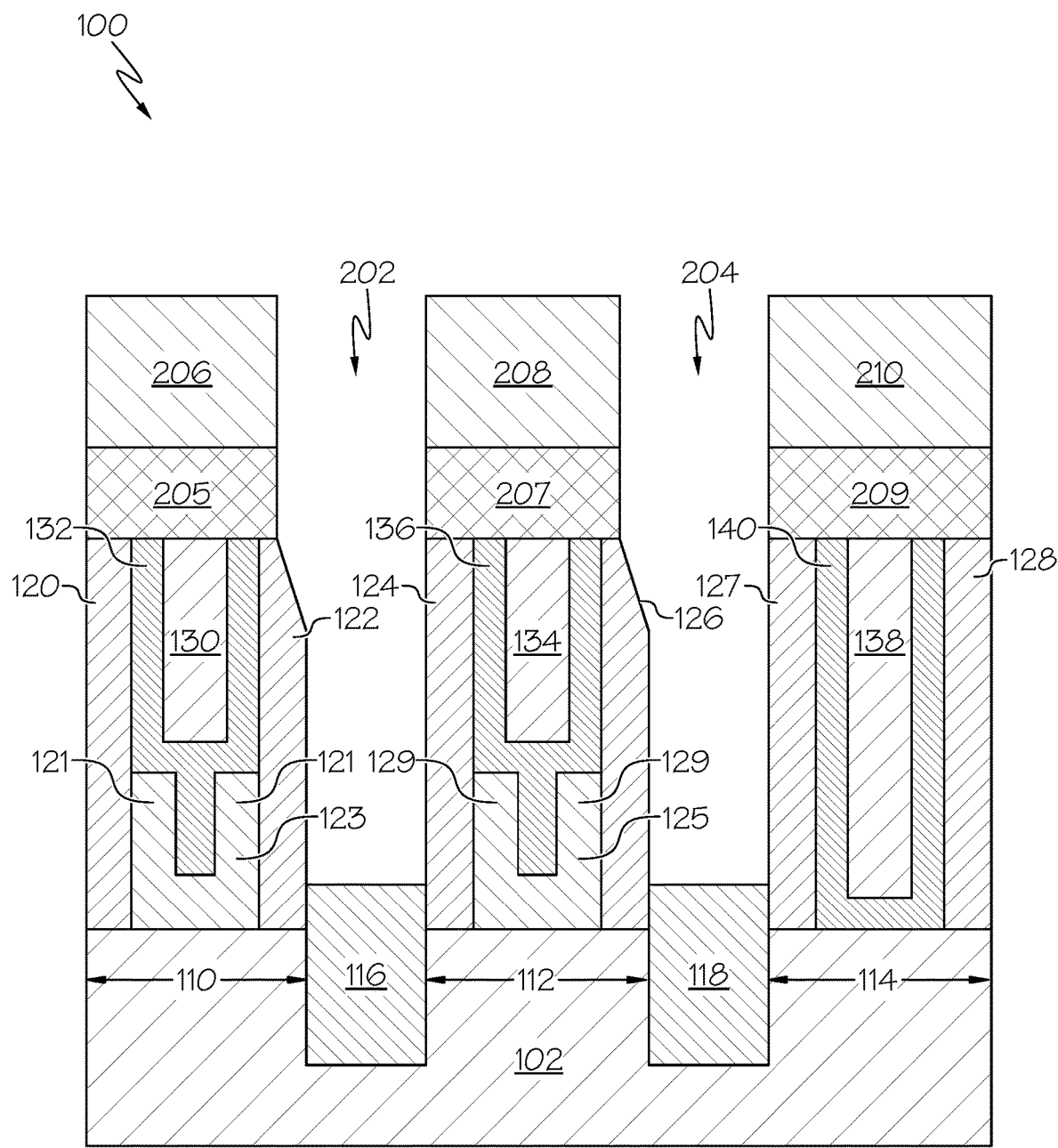
FIG. 2 is a cross-sectional side view of the example semiconductor structure of FIG. 1 at a subsequent point in the example fabrication process.

FIG. 2 illustrates the example semiconductor structure 100 at a point in the example semiconductor fabrication process after a trench silicide (TS) patterning process for forming source/drain metal contacts in the source/drain stacks 114, 115. According to an example TS patterning process, an ILD layer is deposited on, and contacting a top surface, of the semiconductor structure 100 including the plurality of sidewall spacers 120, 122, 124, 126, 127, 128, the plurality of S/D stacks 114, 115, and the plurality of gate stacks 104, 106, 108.

Patterning masks 206, 208, 210, are deposited on, and contacting a top surface of, the ILD layer. For example, patterning mask 206, 208, 210 could comprise one or more of an organic planarization layer (OPL), an anti-reflective coating (ARC), and a photoresist layer; and which may also be referred to as a photolithography material stack. The patterning masks 206, 208, 210, are located directly above, and protect portions 205, 207, 209, of the ILD layer disposed on the gate stacks 104, 106, 108. A TS patterning process can form trenches 202, 204, in the exposed portions of the ILD layer.

Vertical directional etching, such as by reactive ion etching (RIE) using a fluoride based chemistry, vertically etches in the exposed portions of the ILD layer on the S/D stacks 114, 115, and continues vertical etching downward through the inter-layer dielectric material 131, 133, to form first and second source/drain vertical trenches 202, 204. The source/drain vertical trenches 202, 204, extend downward to, and reach and expose, a top surface of the respective epitaxial active region 116, 118, in the substrate 102, as shown in FIG. 2. The exposed top surface of the epitaxial active regions 116, 118, may be also referred to as source/drain active areas 116, 118.

Figure 3:
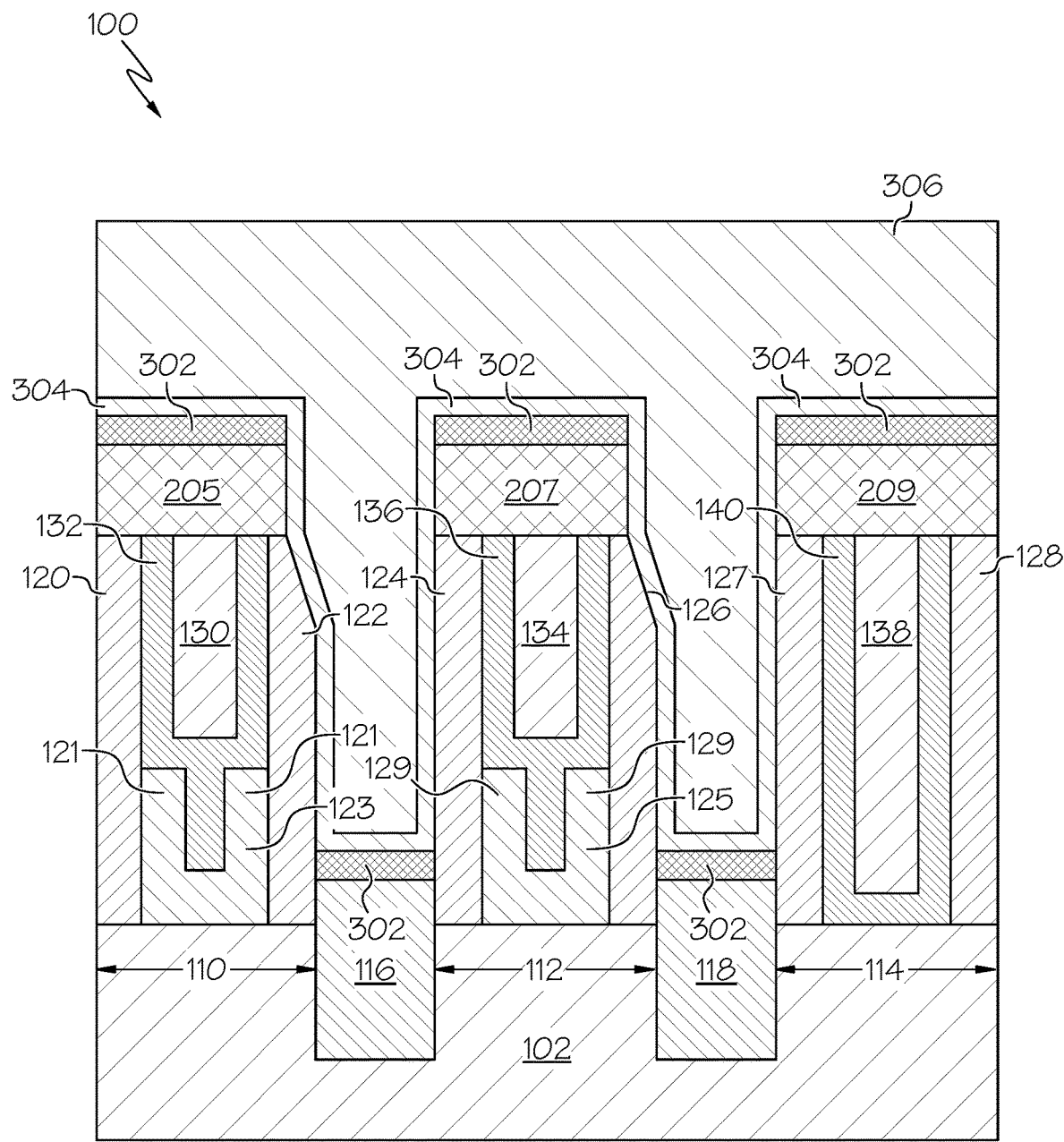
FIG. 3 is a cross-sectional side view of the example semiconductor structure of FIG. 2 at a subsequent point in the example fabrication process.

As shown in FIG. 3, continuing with the semiconductor fabrication process, an ash process removes the patterning mask layer 206, 208, 210, followed by deposition of a titanium film layer 302 directly on, and contacting, exposed top surfaces of the portions 205, 207, 209, of the ILD layer disposed on the gate stacks 104, 106, 108. The titanium film layer 302, additionally, is deposited directly on, and contacting, the source/drain active areas 116, 118, exposed in the first and second source/drain vertical trenches 202, 204. Deposition of the titanium film layer 302 can be performed, for example, using a physical vapor deposition (PVD) process on the exposed top surfaces of the portions 205, 207, 209, of the ILD layer, and the source/drain active areas 116, 118, as shown in FIG. 3.

According to the present example, a conductive material layer (conductive line) 304 is deposited directly on and contacting the exposed surfaces of the semiconductor structure 100, which includes the top surfaces of titanium film layers 302. This can be done using an atomic layer deposition (ALD) process that deposits a thin film coat material (a conductive liner) on the exposed surfaces of the semiconductor structure 100, which includes the exposed sidewalls of the first and second source/drain vertical trenches 202, 204, and the top surfaces of titanium film layers 302, as shown in FIG. 3. The conductive material layer (conductive line) 304, according to the example, is made of material comprising titanium or titanium nitride, or another conductive material including titanium.

Following the deposition of the conductive liner 304, a metallization deposition step deposits a conductive material 306 on, and contacting, the exposed conductive liner 304. In particular, the conductive material 306 fills the first and second source/drain vertical trenches 202, 204, as shown in FIG. 3. According to the example, the conductive material fill 306 comprises cobalt, or Ru, or W, or another conductive material according to various embodiments of the invention.

Figure 4:
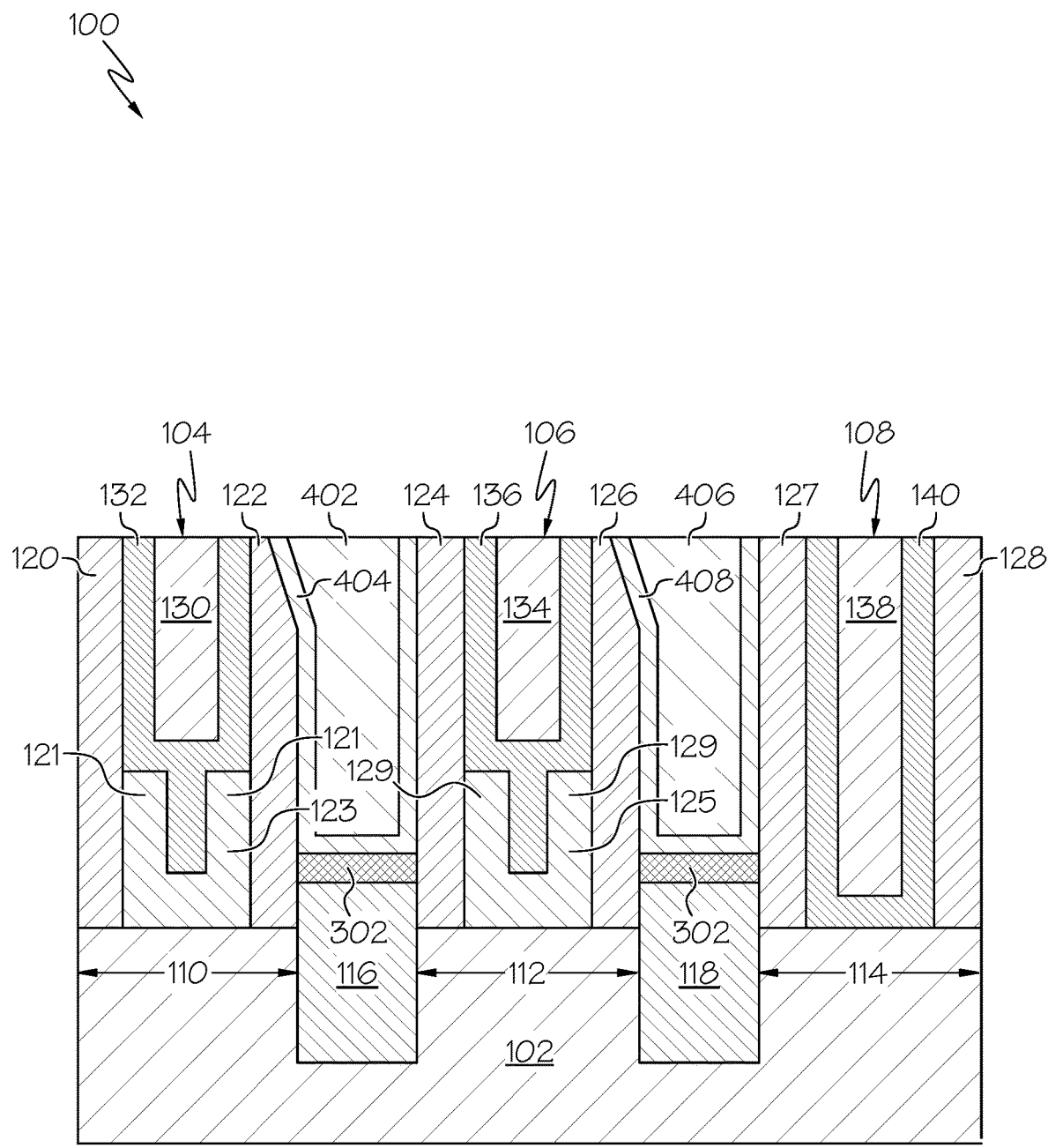
FIG. 4 is a cross-sectional side view of the example semiconductor structure of FIG. 3 at a subsequent point in the example fabrication process.

As shown in FIG. 4, continuing with the semiconductor fabrication process, a planarization process, such as by a chemical and/or mechanical planarization (CMP) step or an etching step, removes the upper layers of the semiconductor structure 100, thereby exposing a top surface of the inner metal core 130, 134, 138, and of the respective outer metal liner 132, 136, 140, of the plurality of gate stacks 104, 106, 108. This planarization process also segments the overall deposited conductive liner 304 (see FIG. 3) into two separate outer metal liners 404, 408, which surround respective two separate inner metal cores 402, 406, in the respective first and second source/drain stacks 114, 115. In this example, the two inner metal cores 402, 406, are made of cobalt or another conductive material. The two outer metal liners 404, 408, according to the example, are made of titanium or titanium nitride, or another conductive material including titanium.

Figure 5:
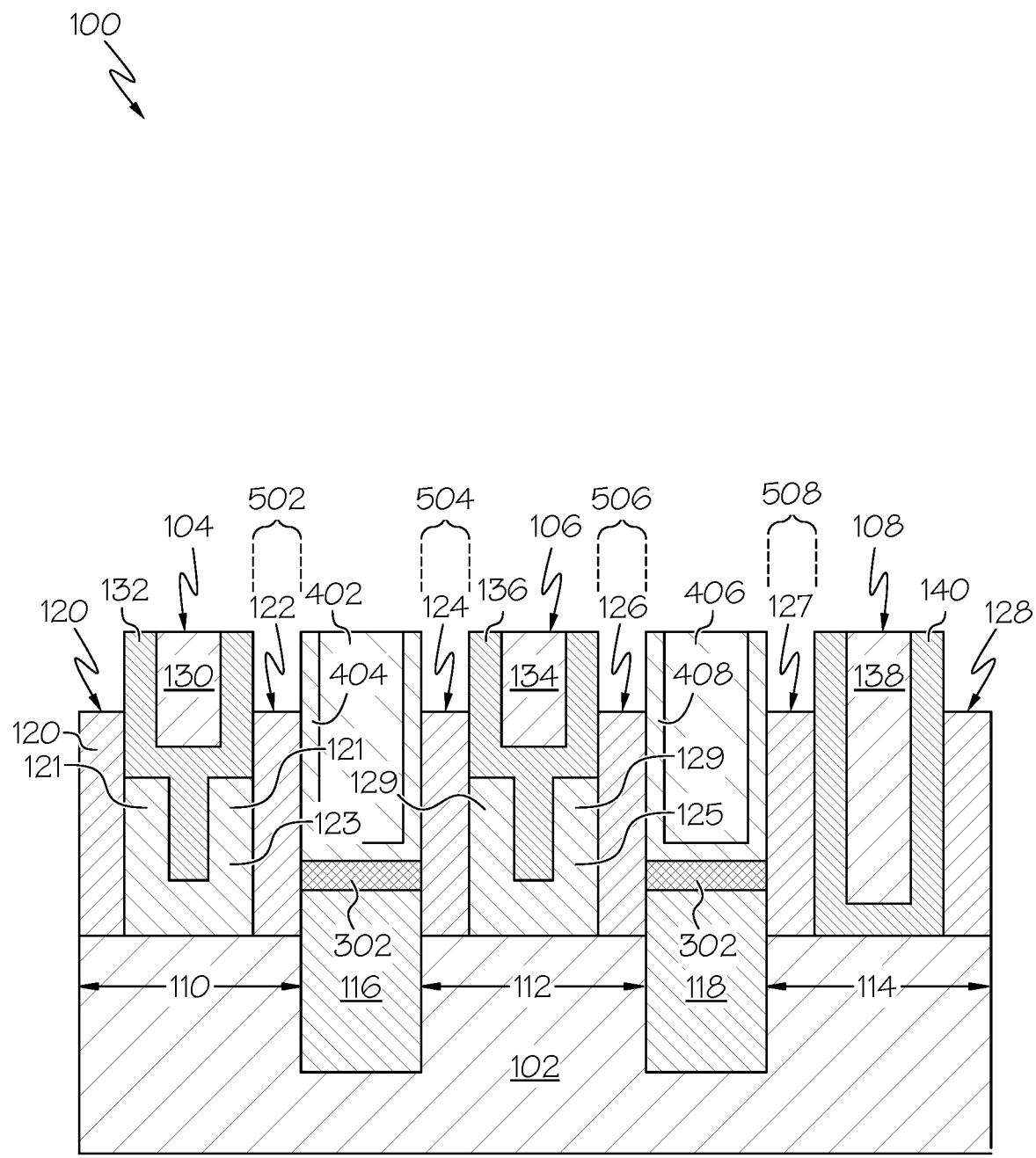
FIG. 5 is a cross-sectional side view of the example semiconductor structure of FIG. 4 at a subsequent point in the example fabrication process.

Continuing in the example semiconductor fabrication process, with reference to FIG. 5, the plurality of sidewall spacers 120, 122, 124, 126, 127, 128, are selectively etched, and thereby recessed (pulled down), forming several recessed-spacer trenches 502, 504, 506, 508, that expose in each recessed-spacer trench 502, 504, 506, 508, a portion of each respective outer metal liner 132, 404, 136, 408, and 140, as shown in FIG. 5. The nitride spacers 120, 122, 124, 126, 127, 128, can be selectively etched, for example, by any suitable dry etch or wet etch process or a combination.

Figure 6:
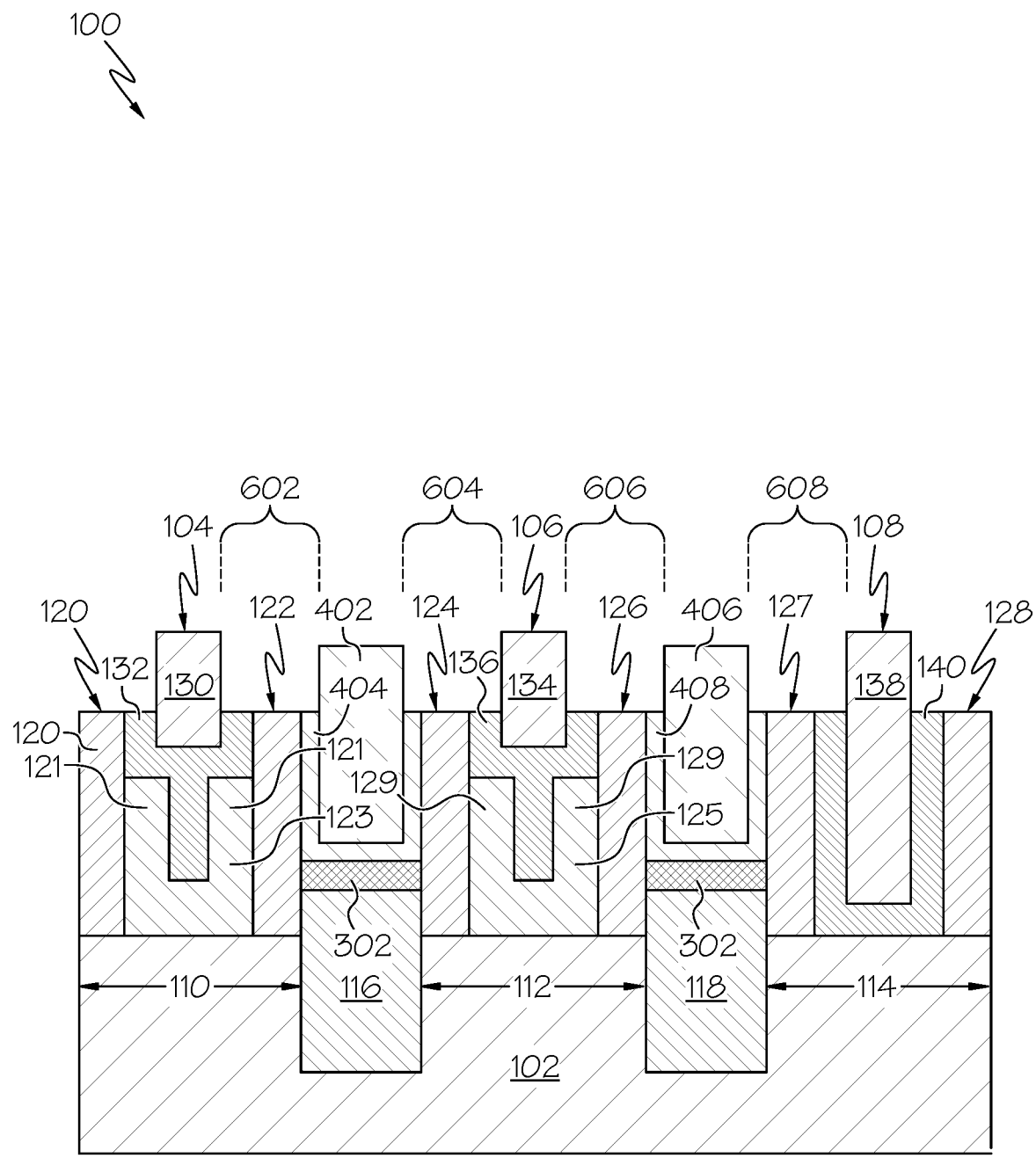
FIG. 6 is a cross-sectional side view of the example semiconductor structure of FIG. 5 at a subsequent point in the example fabrication process.

The example semiconductor fabrication process continues, with reference to FIG. 6, by selectively etching (recessing) the exposed portion of each of the outer metal liners 132, 404, 136, 408, and 140, thereby widening the trenches 502, 504, 506, 508, that were formed after the selective etching (recessing) of the sidewall spacers 120, 122, 124, 126, 127, 128. FIG. 6 shows these widened trenches 602, 604, 606, 608. A selective TiN etch process, for example, can be any suitable dry etch or wet etch process or a combination.

The selective etching of the exposed portion of the outer metal liners 132, 404, 136, 408, and 140, in the trenches 502, 504, 506, 508, exposes the sidewall surfaces of the respective inner metal cores 130, 402, 134, 406, and 138, in the trenches. The selective etching of the exposed portion of the outer metal liners 132, 404, 136, 408, and 140, in the trenches, also horizontally enlarges the trenches 502, 504, 506, 508, forming the widened trenches 602, 604, 606, 608, over a top surface of the outer metal liners 132, 404, 136, 408, 140, and over a top surface of the sidewall spacers 120, 122, 124, 126, 127, 128, as shown in FIG. 6.

Figure 7:
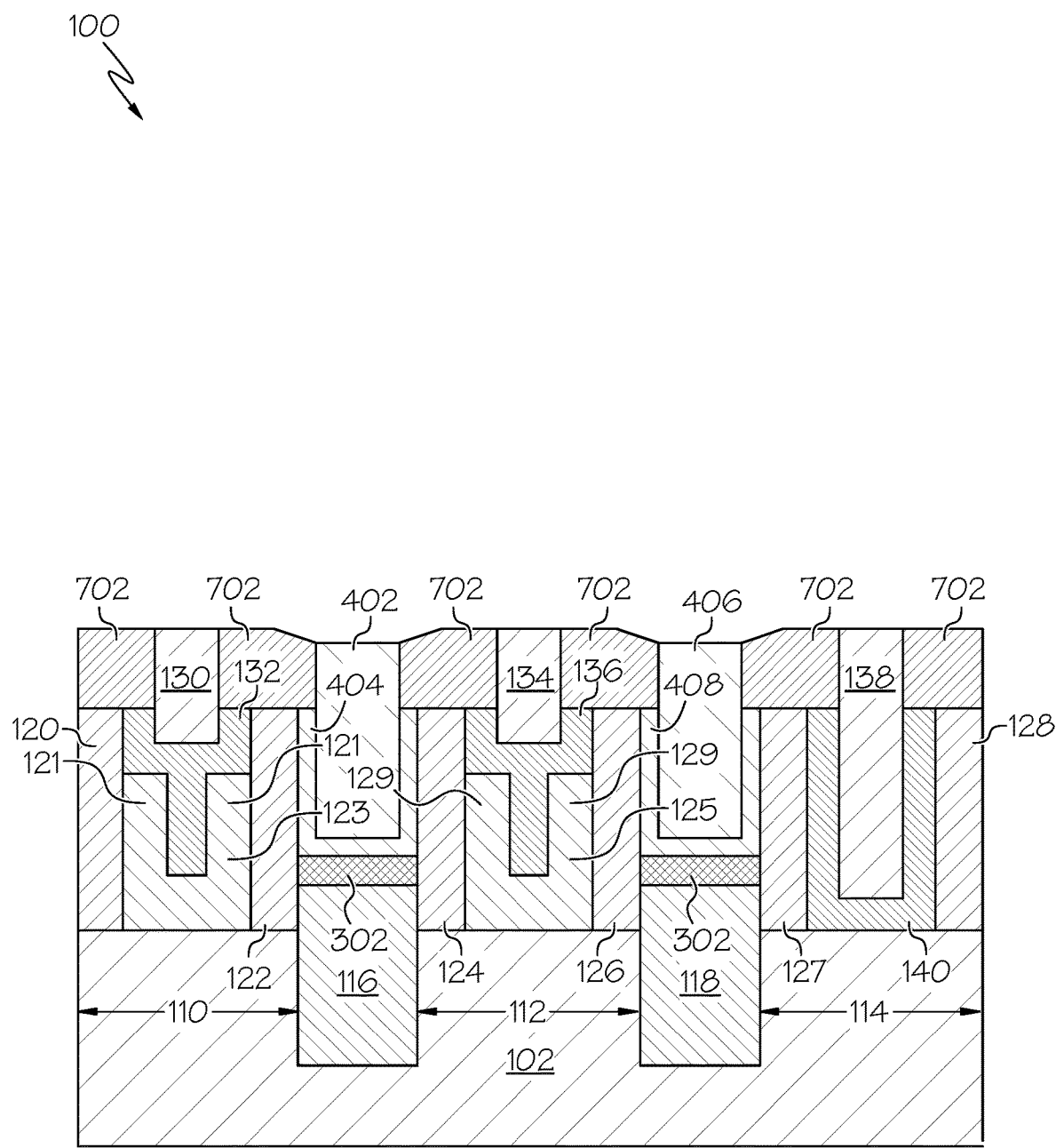
FIG. 7 is a cross-sectional side view of the example semiconductor structure of FIG. 6 at a subsequent point in the example fabrication process.

After forming the widened trenches 602, 604, 606, 608, the fabrication process continues by deposition of a dielectric material 702, such as an ILD material, over the top surfaces of the gate stacks 104, 106, 108, the S/D stacks 114, 115, and the sidewall spacers 120, 122, 124, 126, 127, 128, as shown in FIG. 7. The deposition of the dielectric material 702 fills the widened trenches 602, 604, 606, 608, with dielectric material 702 that contacts sidewall surfaces of the respective inner metal cores 130, 402, 134, 406, and 138, in the widened trenches 602, 604, 606, 608. The dielectric material 702 may include at least one dielectric material selected from the following set of dielectric materials consisting of: Silicon Nitride (SiN), Silicon Carbide (SiC), SiCO, Silicon Oxide (SiO), Silicon Dioxide (SiO$_2$), Carbon Doped Silicon Oxide (SiCOH), SiCH, one or more silicon-based materials with some or all of the Si replaced by Ge, carbon-doped oxides, inorganic oxides, inorganic polymers, hybrid polymers, organic polymers such as polyamides or SiLK™, other carbon-base materials, organo-inorganic materials such as spin-on glasses and silsesquioxane-based materials, diamond-like carbon (DLC, also known as amorphous hydrogenated carbon, α-C:H), or any of the aforementioned materials in porous form, or in a form that changes during processing to or from being porous and/or permeable to being non-porous and/or non-permeable.

After the deposition of the dielectric material 702, an etching process etches back the excess dielectric material exposing the top surfaces of the inner metal cores 130, 402, 134, 406, and 138, and leaving dielectric material 702 filling the widened trenches 602, 604, 606, 608, over the top surfaces of the gate stacks 104, 106, 108, the S/D stacks 114, 115, and the sidewall spacers 120, 122, 124, 126, 127, 128, as shown in FIG. 7. An example of an etching process to etch back the dielectric material 702 can be a dry etch process, or it can also be a planarization process, such as by a chemical and/or mechanical planarization (CMP) step or an etching step, which removes excess material from a top surface of the semiconductor structure 100. In the example shown in FIG. 7, a non-planar top surface (e.g., see the top surfaces of the dielectric material 702 filling the widened trenches 602, 604, 606, 608) could result if a dry etch back process is used. If alternatively a CMP process is used, the resulting top surface of the semiconductor structure 100 will be flat (not shown).

Figure 8:
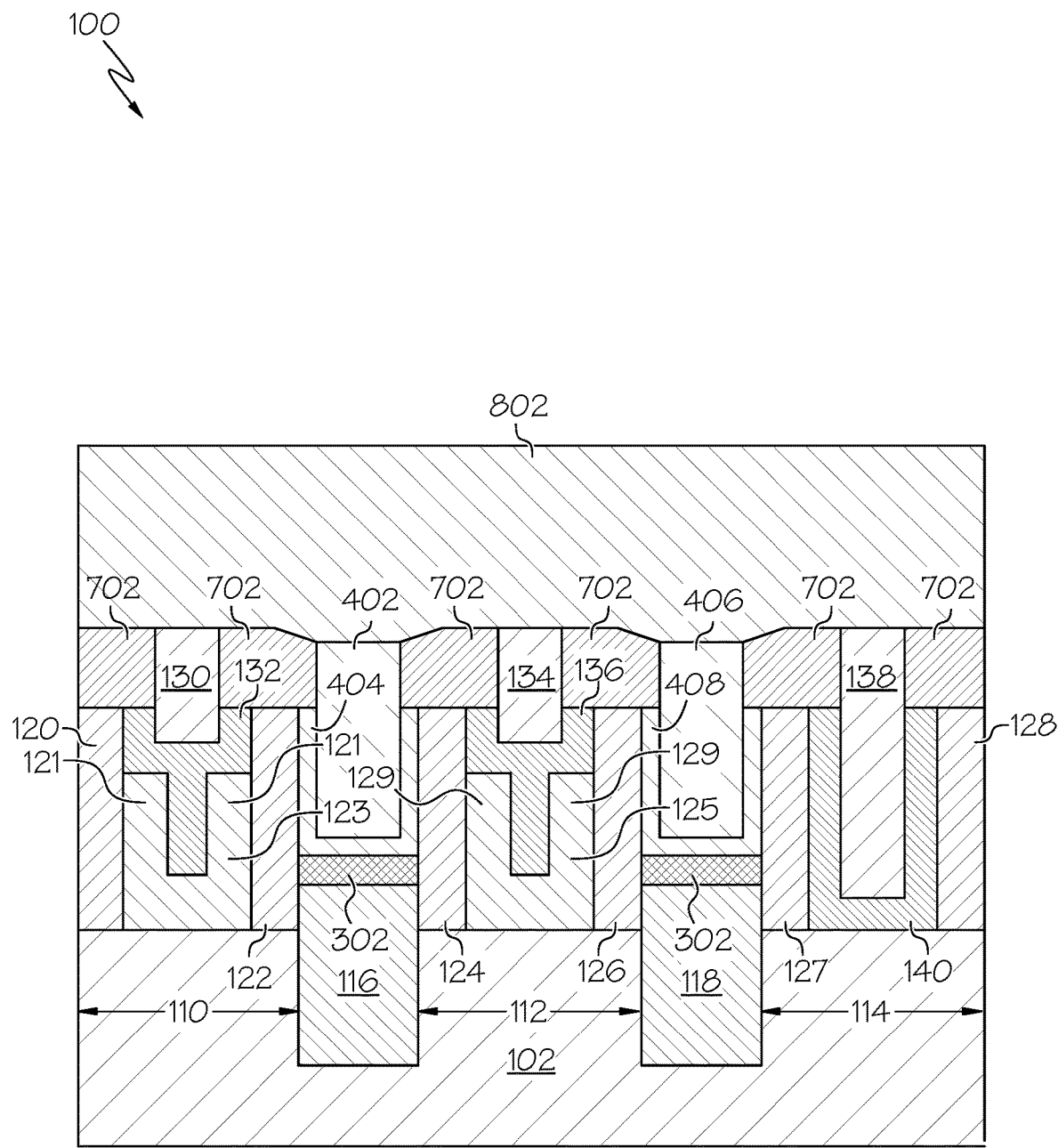
FIG. 8 is a cross-sectional side view of the example semiconductor structure of FIG. 7 at a subsequent point in the example fabrication process.

The semiconductor fabrication process continues, with reference to FIG. 8, by deposition of an ILD material layer 802 on the exposed top surfaces of the inner metal cores 130, 402, 134, 406, and 138, and on the dielectric material 702 fill in the widened trenches 602, 604, 606, 608. With an ILD material comprising an oxide material or a low-K dielectric material, for example, an ILD material layer 802 can be a thickness of 20-80 nm. The ILD material layer 802 will be used, in this example, to form MOL metallization layer electrical metal contacts (electrical junctions) in the ILD material layer 802.

Figure 9:
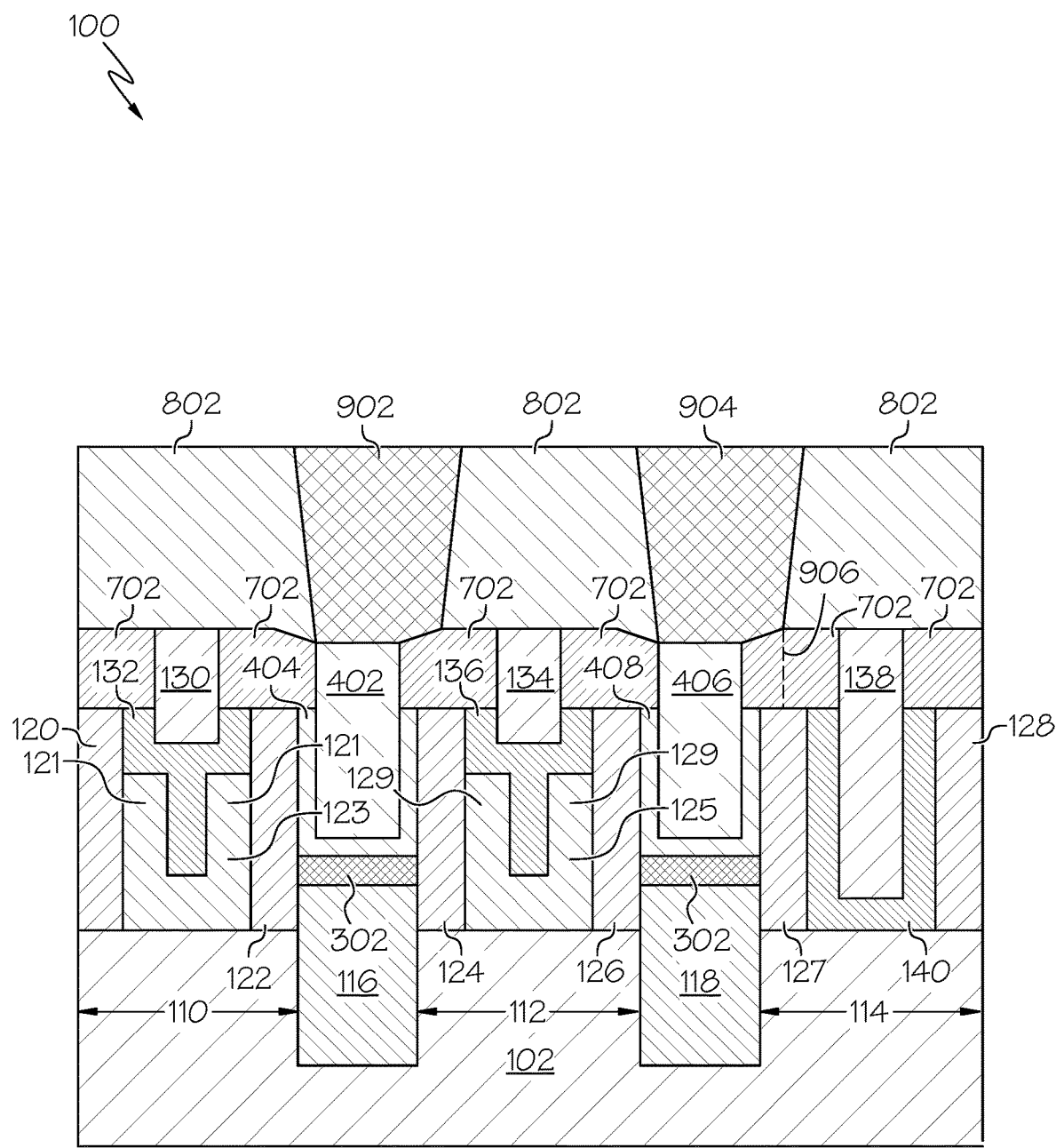
FIG. 9 is a cross-sectional side view of the example semiconductor structure of FIG. 8 at a subsequent point in the example fabrication process.
Figure 10:
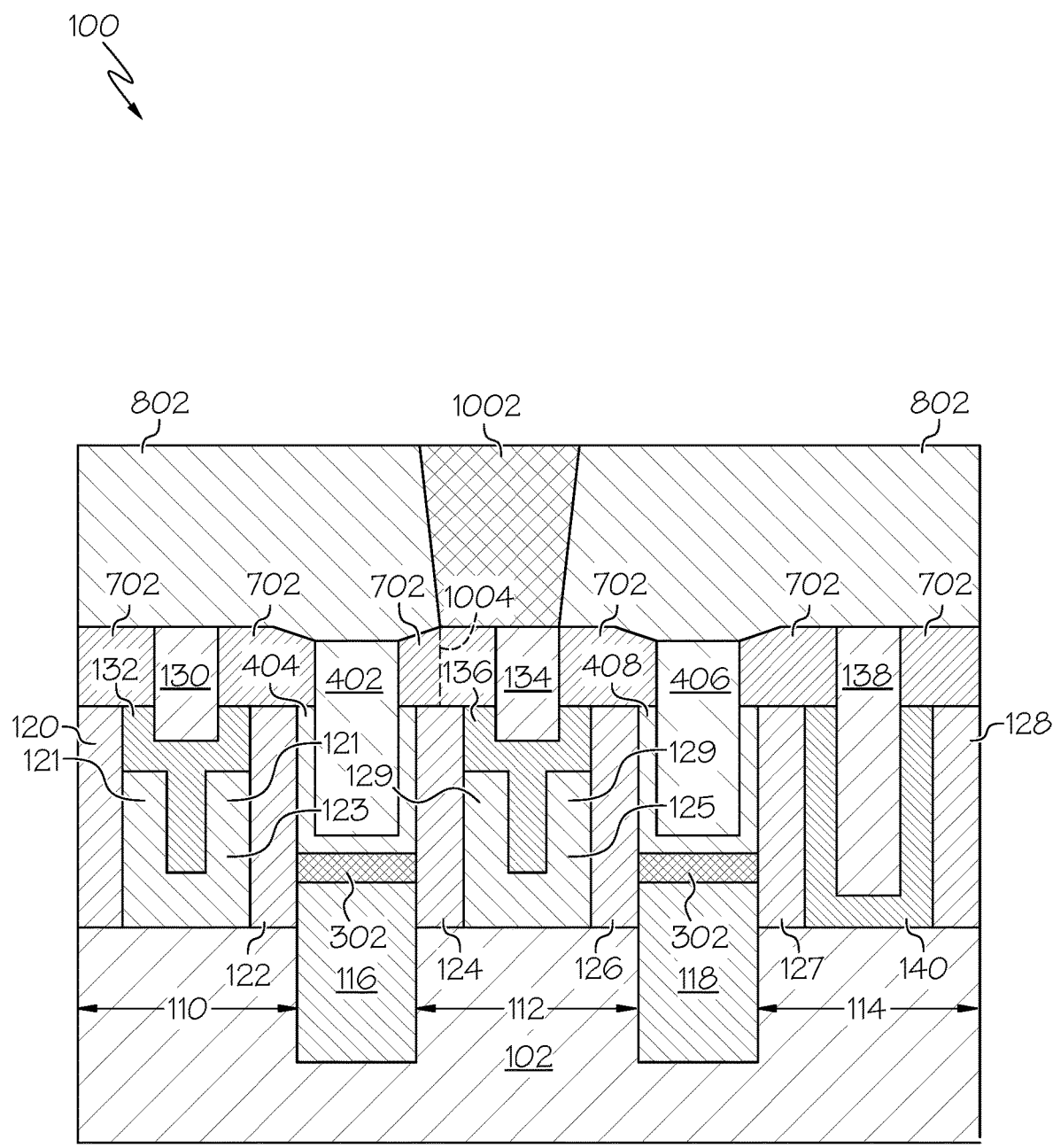
FIG. 10 is a cross-sectional side view of the example semiconductor structure of FIG. 9, the cross-sectional side view is taken at line B-B, as illustrated in FIG. 12, with arrows indicating a direction of the cross-sectional side view.

FIG. 9 shows examples of source/drain metal contacts (electrical junctions) 902, 904, formed by a metal contact patterning process in the ILD material layer 802. These source/drain metal contacts 902, 904, can be made of a conductive material, such as copper. Other conductive materials may be used in the source/drain metal contacts 902, 904, according to various embodiments. These source/drain metal contacts 902, 904, are disposed directly above, and contacting, the respective source/drain inner metal cores 402, 406, in the respective first and second source/drain stacks 114, 115. In the example, these inner metal cores 402, 406, can be made of cobalt material. Other conductive materials may be used in the inner metal cores 402, 406, according to various embodiments.

The depth of the dielectric material layer 702 filling the widened trenches 602, 604, 606, 608, provides additional electrically insulating separation between the formed source/drain metal contacts 902, 904, and the top surfaces of the inner metal cores 130, 134, 138, in adjacent gate stacks 104, 106, 108. It is understood that the widened trenches 602, 604, 606, 608, are wider than the trenches 502, 504, 506, 508, formed from the recessed sidewall spacers 120, 122, 124, 126, 127, 128, because of the additionally recessed outer metal liners 132, 404, 136, 408, and 140. The dielectric material layer 702 filling the widened trenches 602, 604, 606, 608, provides the additional electrically insulating separation. This additional separation provides an improved design margin 906 for possible overlay shifts in the patterning of the source/drain metal contacts 902, 904, in the ILD material layer 802 (e.g., MOL metallization layer), as illustrated in FIG. 9. With reference to FIGS. 5 and 6, compare the limited separation provided by using only the sidewall spacers 120, 122, 124, 126, 127, 128, with the much greater separation provided by using the widened trenches 602, 604, 606, 608, filled with the dielectric material layer 702. The improved design margin 906 allows for more relaxed metal contact pitch tolerances, reduced fabrication process defects, and lower semiconductor product manufacturing costs. This can significantly improve a commercial viability of a semiconductor fabrication process and of related product designs.

FIG. 10 shows an example of a gate metal contact (electrical junction) 1002, formed by a metal contact patterning process in the ILD material layer 802. The gate metal contact 1002 can be made of a conductive material such as copper. Other conductive materials may be used in the gate metal contact 1002, according to various embodiments. The gate metal contact 1002 is disposed directly above, and contacting, the respective gate inner metal core 134, in the respective gate stack 106. In the example, gate metal contact 1002 can be made of cobalt material. Other conductive materials may be used in the gate metal contact 1002, according to various embodiments.

The depth of the dielectric material layer 702 filling the widened trenches provides electrically insulating separation between the formed gate metal contact 1002 and the top surface of the inner metal core 402, 406, in the adjacent S/D stacks 114, 115. It is understood that the widened trenches 602, 604, 606, 608, are wider than the trenches 502, 504, 506, 508, formed from the recessed sidewall spacers 120, 122, 124, 126, 127, 128, because of the additionally recessed outer metal liners 132, 404, 136, 408, and 140. The dielectric material layer 702 filling the widened trenches 602, 604, 606, 608, provides the additional electrically insulating separation. This additional separation provides an improved design margin 1004 for possible overlay shifts in the patterning of the gate metal contact 1002 in the ILD material layer 802 (e.g., MOL metallization layer), as illustrated in FIG. 10.

Figure 11:
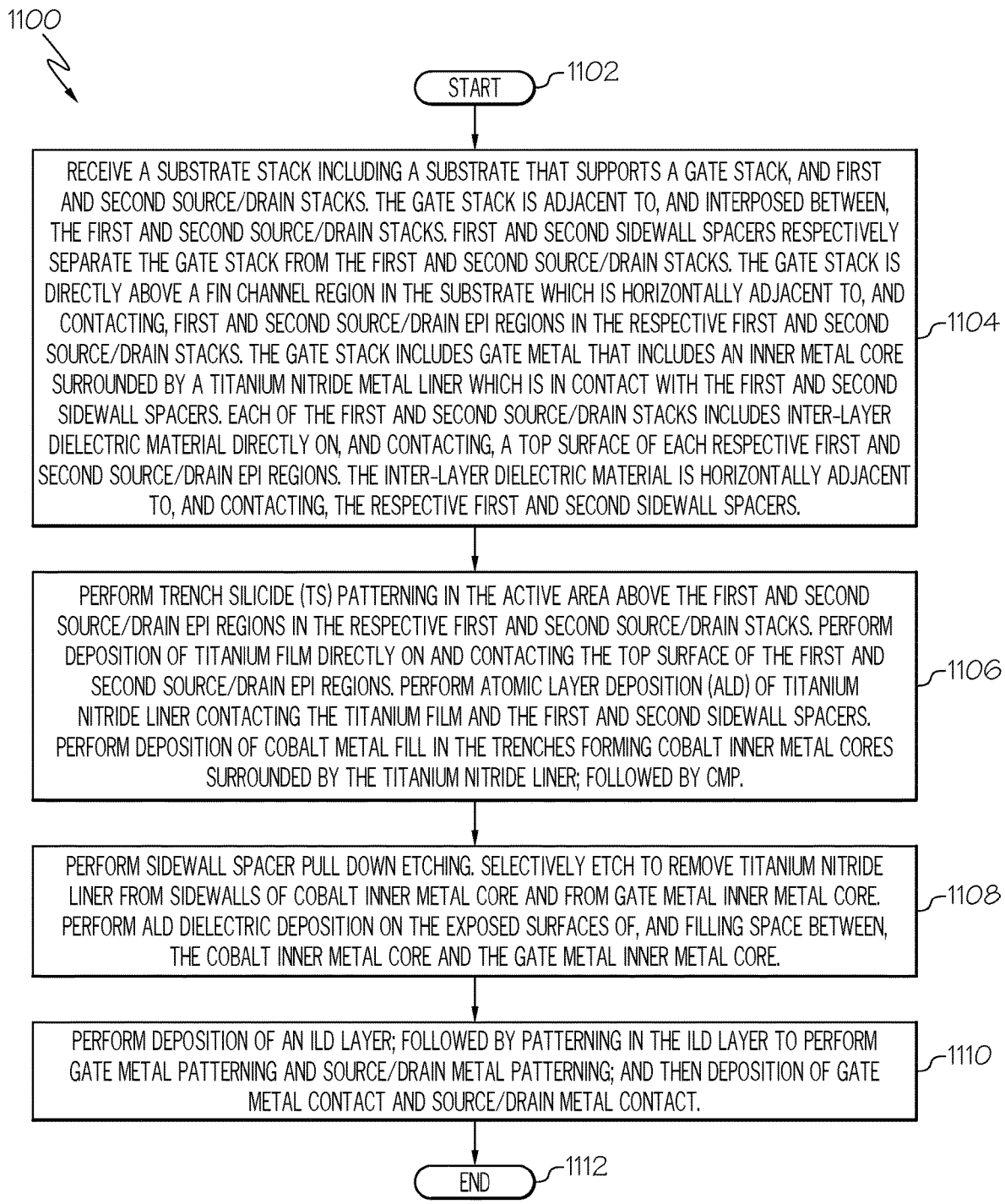
FIG. 11 is an operational flow diagram illustrating an example fabrication process for fabricating a semiconductor structure including a non-self-aligned contact, according to an embodiment of the present invention.

FIG. 11 illustrates an example method 1100 for fabricating non-self-aligned contacts for transistor devices on a substrate. Various embodiments of the invention may include some, and not necessarily all, of the method steps in the illustrated example.

The example fabrication method enters, at step 1102, and immediately proceeds, at step 1104, to receive a substrate stack including a substrate 102 that supports a gate stack 106, and first and second source/drain stacks 114, 115. The gate stack 106 is adjacent to, and interposed between, the first and second source/drain stacks 114, 115. First and second sidewall spacers 124, 126, respectively separate the gate stack 106 from the first and second source/drain stacks 114, 115. The gate stack 106 is directly above a fin channel region 112 in the substrate 102 which is horizontally adjacent to, and contacting, first and second source/drain epi regions 116, 118, in the respective first and second source/drain stacks 114, 115. The gate stack 106 includes gate metal that includes an inner metal core 134 surrounded by a titanium nitride metal liner 136 which is in contact with the first and second sidewall spacers 124, 126. Each of the first and second source/drain stacks 114, 115, includes inter-layer dielectric material 131, 133, directly on, and contacting, a top surface of each respective first and second source/drain epi regions 116, 118. The inter-layer dielectric material 131, 133, is horizontally adjacent to, and contacting, the respective first and second sidewall spacers 124, 126.

The method then proceeds, at step 1206, to perform trench silicide (TS) patterning in the active area above the first and second source/drain epi regions 116, 118, in the respective first and second source/drain stacks 114, 115. The method then performs deposition of titanium film 302 directly on and contacting a top surface of the first and second source/drain epi regions 116, 118. The method then performs atomic layer deposition (ALD) of titanium nitride liner 304 contacting the titanium film 302 and the first and second sidewall spacers 124, 126. A deposition of cobalt metal fill 306 in the trenches forms cobalt inner metal cores surrounded by the titanium nitride liner 304, which is then followed by a CMP process.

The fabrication method, at step 1108, then performs a pull down etching of the sidewall spacers 124, 126, forming several recessed-spacer trenches that expose in each recessed-spacer trench a portion of each respective titanium nitride outer metal liner 132, 404, 136, 408, and 140. A selective etch of the titanium nitride outer metal liners is then performed which removes the titanium nitride liner from sidewalls of the cobalt inner metal core 402, 406, and from sidewalls of the gate metal inner metal core 130, 134, 138. This selective etching horizontally enlarges the trenches forming widened trenches over a top surface of the outer metal liners 132, 404, 136, 408, and 140, and over a top surface of the sidewall spacers 120, 122, 124, 126, 127, 128.

ALD deposition of dielectric material 702 is performed on the exposed surfaces of, and filling space between, the cobalt inner metal cores 402, 406, and the gate metal inner metal cores 130, 134, 138.

The fabrication method, at step 1110, performs deposition of an ILD layer 802 on the exposed top surfaces of the inner metal cores 130, 402, 134, 406, and 138, and on the dielectric material 702 fill in the widened trenches. This is followed by patterning in the ILD layer 802 to perform gate metal patterning and source/drain metal patterning forming vertical via trenches in the ILD layer 802

The patterning is followed by deposition of conductive material in the vertical via trenches forming a vertical gate metal contact 1002 and vertical source/drain metal contacts 902, 904. The deposition can include a chemical vapor deposition of conductive material 902, 904, 1002, (e.g., a chemical vapor deposition of metal) in the vertical via trenches, or a metal reflow process, that fills the vertical via trenches with the conductive material. This deposition forms a gate metal contact 1002 and S/D metal contacts 902, 904, in the ILD layer 802. The fabrication method is then exited, at step 1112.

The design of the non-self-aligned contacts is resistant to pitch variability and overlay shifts in the patterning of the gate metal contact 1002 and S/D metal contacts 902, 904, in the ILD layer 802. The improved design margin 906, 1004, allows for more relaxed metal contact pitch tolerances, reduced fabrication process defects, and lower semiconductor product manufacturing costs. This can significantly improve a commercial viability of a semiconductor fabrication process and of related product designs.

Although specific embodiments of the invention have been disclosed, those having ordinary skill in the art will understand that changes can be made to the specific embodiments without departing from the scope of the invention. The scope of the invention is not to be restricted, therefore, to the specific embodiments, and it is intended that the appended claims cover any and all such applications, modifications, and embodiments within the scope of the present invention.

It should be noted that some features of the present invention might be used in one embodiment thereof without use of other features of the present invention. As such, the foregoing description should be considered as merely illustrative of the principles, teachings, examples, and exemplary embodiments of the present invention, and not a limitation thereof.

In addition, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A method of fabricating a semiconductor structure including at least one non-self-aligned contact in a metallization layer, the method comprising:
   providing a semiconductor material stack including
      a substrate;
      a plurality of layers,
      a gate stack,
      a source-drain stack, and
      a sidewall spacer adjacent to, interposed between, and contacting, the gate stack and the source-drain stack;
   forming gate metal in the gate stack, the gate metal including a first inner metal core and first outer metal liner contacting the first inner metal core and the sidewall spacer;
   forming a source-drain contact in the source-drain stack, the source-drain contact including a second inner metal core and second outer metal liner contacting the second inner metal core and the sidewall spacer;
   recessing the sidewall spacer exposing a portion of the first outer metal liner and a portion of the second outer metal liner;
   recessing the exposed portions of the first and second outer metal liners to expose a portion of the first inner metal core and a portion of the second inner metal core; and
   forming a dielectric layer on and in contact with the exposed portions of the first inner metal core and the second inner metal core, and further in contact with the recessed first outer metal liner and second outer metal liner.

2. The method of claim 1, wherein the dielectric layer is made of an inter-layer dielectric (ILD) material, and wherein the formation of the dielectric layer comprises deposition of the ILD material, and further includes:
   deposition of the ILD material thereby filling a trench formed by the recessed sidewall spacer and the recessed exposed portions of the first and second outer metal liners, and the ILD material contacting a sidewall of the first inner metal core, a sidewall of the second inner metal core, and respective top surfaces of the recessed first outer metal liner, second outer metal liner, and sidewall spacer.

3. The method of claim 1, wherein the second inner metal core comprises at least one conductive material selected from the following set of conductive materials consisting of: Copper (Cu), Cobalt (Co), Aluminum (Al), Tungsten (W), Titanium (Ti), Tantalum (Ta), Ruthenium (Ru), Hafnium (Hf), Zirconium (Zr), Nickel (Ni), Platinum (Pt), Tin (Sn), Silver (Ag), Gold (Au), a conducting metallic compound material, or a conducting metal alloy including at least one of the preceding conductive materials.

4. The method of claim 3, wherein the second outer metal liner comprises at least one conductive material selected from the following set of conductive materials consisting of: Titanium (Ti), Titanium Nitride (TiN), a conducting metallic compound material, or a conducting metal alloy including at least one of the preceding conductive materials.

5. The method of claim 1, wherein the first inner metal core comprises at least one conductive material selected from the following set of conductive materials consisting of: Copper (Cu), Cobalt (Co), Aluminum (Al), Tungsten (W), Titanium (Ti), Tantalum (Ta), Ruthenium (Ru), Hafnium (Hf), Zirconium (Zr), Nickel (Ni), Platinum (Pt), Tin (Sn), Silver (Ag), Gold (Au), a conducting metallic compound material, or a conducting metal alloy including at least one of the preceding conductive materials.

6. The method of claim 5, wherein the first outer metal liner comprises at least one conductive material selected from the following set of conductive materials consisting of: Titanium (Ti), Titanium Nitride (TiN), a conducting metallic compound material, or a conducting metal alloy including at least one of the preceding conductive materials.

7. The method of claim 1, wherein the dielectric layer is made of a dielectric material which comprises at least one dielectric material selected from the following set of dielectric materials consisting of:

Silicon Nitride (SiN), Silicon Carbide (SiC), SiCO, Silicon Oxide (SiO), Silicon Dioxide ($SiO_2$), Carbon Doped Silicon Oxide (SiCOH), SiCH, one or more silicon-based materials with some or all of the Si replaced by Ge, carbon-doped oxides, inorganic oxides, inorganic polymers, hybrid polymers, organic polymers such as polyamides or SiLK™, other carbon-base materials, organo-inorganic materials such as spin-on glasses and silsesquioxane-based materials, diamond-like carbon (DLC, also known as amorphous hydrogenated carbon, $\alpha$-C:H), or any of the aforementioned materials in porous form, or in a form that changes during processing to or from being porous and/or permeable to being non-porous and/or non-permeable.

8. The method of claim 1, wherein the substrate comprises at least one material selected from the following set of materials consisting of:

silicon (Si), silicon germanium (SiGe), silicon carbide (SiC), Si:C (carbon doped silicon), silicon germanium carbide (SiGeC), carbon doped silicon germanium (SiGe:C), III-V compound semiconductor, or II-V compound semiconductor, an organic semiconductor, a layered semiconductor, a silicon-on-insulator, a SiGe-on-insulator, amorphous material, polycrystalline material, monocrystalline material, or a hybrid oriented (HOT) semiconductor material, or a combination of the materials in this set.

9. The method of claim 1, wherein the sidewall spacer comprises at least one dielectric material selected from the following set of dielectric materials consisting of:

Silicon Nitride (SiN), Silicon Carbide (SiC), SiCO, Silicon Oxide (SiO), Silicon Dioxide ($SiO_2$), Carbon Doped Silicon Oxide (SiCOH), SiCH, one or more silicon-based materials with some or all of the Si replaced by Ge, carbon-doped oxides, inorganic oxides, inorganic polymers, hybrid polymers, organic polymers such as polyamides or SiLK™, other carbon-base materials, organo-inorganic materials such as spin-on glasses and silsesquioxane-based materials, diamond-like carbon (DLC, also known as amorphous hydrogenated carbon, $\alpha$-C:H), or any of the aforementioned dielectric materials in porous form, or in a form that changes during processing to or from being porous and/or permeable to being non-porous and/or non-permeable.

10. A method of fabricating a semiconductor structure including at least one non-self-aligned contact in a metallization layer, the method comprising:
providing a semiconductor material stack including
a substrate;
a plurality of layers,
a gate stack,
a source-drain stack, and
a sidewall spacer adjacent to, interposed between, and contacting, the gate stack and the source-drain stack;
forming gate metal in the gate stack, the gate metal including an inner metal core and an outer metal liner contacting the inner metal core and the sidewall spacer;
recessing the sidewall spacer exposing a portion of the outer metal liner;
recessing the exposed portion of the outer metal liner to expose a portion of the inner metal core; and
forming a dielectric layer on and in contact with the exposed portions of the inner metal core and the recessed outer metal liner.

11. The method of claim 10, wherein the dielectric layer is made of a dielectric material which comprises at least one dielectric material selected from the following set of dielectric materials consisting of:

Silicon Nitride (SiN), Silicon Carbide (SiC), SiCO, Silicon Oxide (SiO), Silicon Dioxide ($SiO_2$), Carbon Doped Silicon Oxide (SiCOH), SiCH, one or more silicon-based materials with some or all of the Si replaced by Ge, carbon-doped oxides, inorganic oxides, inorganic polymers, hybrid polymers, organic polymers such as polyamides or SiLK™, other carbon-base materials, organo-inorganic materials such as spin-on glasses and silsesquioxane-based materials, diamond-like carbon (DLC, also known as amorphous hydrogenated carbon, $\alpha$-C:H), or any of the aforementioned dielectric materials in porous form, or in a form that changes during processing to or from being porous and/or permeable to being non-porous and/or non-permeable.

* * * * *